Nov. 24, 1970 R. L. CARBREY 3,543,264
CIRCUIT FOR SELECTIVELY APPLYING A VOLTAGE TO AN IMPEDANCE
Filed June 23, 1967

INVENTOR
R. L. CARBREY
BY J. P. Kearns
ATTORNEY

United States Patent Office 3,543,264

Patented Nov. 24, 1970

3,543,264

CIRCUIT FOR SELECTIVELY APPLYING A VOLTAGE TO AN IMPEDANCE

Robert L. Carbrey, Madison, N.J., assignor to Bell Telephone Laboratories, Incorporated, Murray Hill, N.J., a corporation of New York Filed June 23, 1967, Ser. No. 648,418
Int. Cl. H03k 13/04
U.S. Cl. 340—347 7 Claims

ABSTRACT OF THE DISCLOSURE

A transistor-operated, switched-resistor digital-to-analog converter employable as a hybrid multiplier in which a plurality of pairs of class B operated transistors selectively switch a plurality of weighted resistors in response to signals from a digital signal source between ground and a voltage to provide analog output voltages. A resistor is connected between an output junction of each class B operated pair of transistors and the digital signal source to provide a current waveform which minimizes saturation voltage variations in each class B transistor pair. The analog output signal from the digital-to-analog converter is inverted and fed into the output junction of each class B transistor pair as a weighted current signal to further reduce saturation voltage variations in each class B transistor pair.

BACKGROUND OF THE INVENTION

Field of the invention

This invention relates to a circuit which enables a polarized switch to drive current through a two-part impedance in either direction and particularly to a saturated switching circuit in a hybrid multiplier which minimizes saturation voltage variations due to analog and digital input value variations.

Description of the prior art

A conventional transistor-operated, switched-resistor digital-to-analog converter employs a plurality of saturated transistor switching circuits responsive to a coded digital input signal to selectively drive a plurality of weighted resistors between first and second reference voltage levels to provide an analog output voltage. This digital-to-analog converter may be used to multiply first and second time-varying quantities by presenting the first time-varying quantity as the coded digital input signal and the second time-varying quantity as the difference between the first and second reference voltage levels.

When a conventional switched-resistor digital-to- analog converter is so employed, however, variations in (1) the first and second reference voltages levels and (2) the coded digital input signals vary the current through the plurality of weighted resistors. This current in turn flows in saturated transistors of the saturated transistor switching circuits to cause saturation voltage variations. Errors thereby result in the analog output voltage. For some codes employed, each of the plurality of weighted resistors has a different value so that even if the first and second input quantities are constant, the saturation current in each associated transistor will be different. Resultant different saturation voltages for each transistor cause further output errors.

Presently, hybrid multipliers of the type described suffer further because transistor switches will not operate if improperly biased. Thus, one cannot change the polarity of the difference between the first and second reference voltage levels during real time operation.

BRIEF DESCRIPTION OF THE INVENTION

The present invention contemplates a saturated switching circuit usable in a switched-resistor digital-to-analog converter in which first controlled electrodes of first and second devices each having a pair of controlled electrodes and a control electrode are joined together and to a first side of a switched bias impedance. The other side of the switched bias impedance is connected to a signal source which also provides driving signals for the control electrodes of the first and second devices.

In one embodiment of the invention an output signal from the digital-to-analog converter is inverted and fed into the junction of the first controlled electrodes as a current signal to minimize saturation voltage variations of the first and second devices.

DETAILED DESCRIPTION

Figures 1, 2, 3, 4:
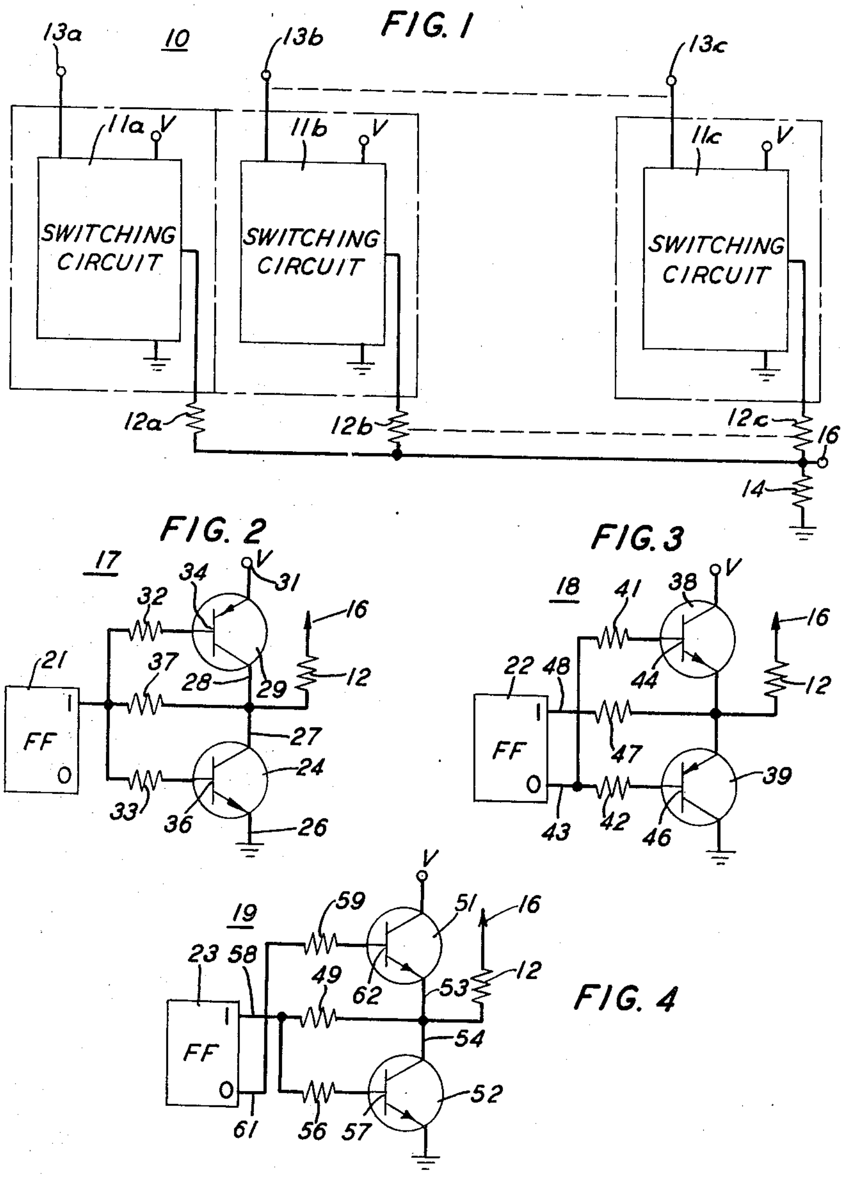
FIG. 1 is a circuit drawing of a switched-resistor digital-to-analog converter employable as a hybrid multiplier which may include saturated transistor switching circuits embodying the principles of this invention.
FIGS. 2, 3, and 4 depict species of the novel switching circuit of this invention.

Referring now to FIG. 1, there is seen a digital-to-analog converter or hybrid multiplier 10 including a plurality of electronic switching circuits 11*a*, 11*b*, and 11*c*, for selectively switching a first side of a plurality of resistors 12*a*, 12*b*, and 12*c*, respectively, between ground and a voltage V in response to digital signals applied by a source, not shown, to a plurality of input terminals 13*a*, 13*b*, and 13*c*, respectively. The other ends of the resistors 12*a*, 12*b*, and 12*c* are joined to each other and to a first side of a resistor 14 at an analog voltage output terminal 16. The other side of the resistor 14 is connected to ground. It is apparent that the output voltage at the terminal 16 will be a sum of the currents flowing through resistors 12*a*, 12*b*, and 12*c* times the value of the resistance 14. The resistors 12*a*, 12*b* and 12*c* may be weighted according to a digital code so that if the signals at the inputs 13*a*, 13*b*, and 13*c* are similarly digitally coded, an analog output proportional thereto will be provided at the output terminal 16. It is further apparent that the voltage V may be varied so that the signal at the output terminal 16 will be an analog voltage proportional to the product of the number represented by the digitally coded input and the analog voltage V.

It should be noted that when one employs an electronic switching circuit to switch a resistor between first and second voltage levels provided by a voltage source, the voltage levels impressed by the switching circuit on the resistor are not exactly the voltage levels of the source but differ therefrom by an amount equal to the saturation voltages of electronic devices in the switching circuit. Variations in current through the resistor result in variations in the saturation voltage of the electronic devices and therefore introduce variable errors in the voltage levels to which the resistor is switched. While a constant error due to device saturation voltage can be easily compensated, a variable device saturation voltage produces uncompensated errors. It is known that the saturation voltage versus current characteristics of many electronic switching devices, such as tubes and transistors, is a logarithmic function. Therefore, the dynamic output impedance of such a saturated device decreases as the saturation bias current increases. This means that for a given output current variation the device saturation voltage variation decreases as the saturation bias current increases.

FIGS. 2, 3, and 4 each show one of a family of circuits 17, 18 and 19, respectively, each driven by a flip-flop 21, 22, and 23, respectively. A plurality of either of the circuits 17, 18 and 19 may be employed as the electronic switching circuits 11*a*, 11*b*, and 11*c*. The flip-flops 21, 22, and 23, may be part of the digital signal source, not shown.

The circuit 17 in FIG. 2 includes an NPN transistor 24 having an emitter 26 connected to ground and a collector 27 connected to collector 28 of a PNP transistor 29 whose emitter 31 is connected to a voltage source V, not shown. A pair of resistors 32 and 33 are connected between an output of the flip-flop 21 and bases 34 and 36 of the transistors 29 and 24, respectively. A switched bias resistor 37 is provided between the output of the flip-flop 21 and the junction of the collectors 27 and 28. When the circuit 17 is employed in the digital-to-analog converter shown in FIG. 1, the junction of the collectors 27 and 28 is connected to drive the appropriate resistor 12, the other end of which is connected to the analog output terminal 16.

The flip-flop 21 provides at its output one of two voltage levels, one being less than ground and the other being greater than the voltage V. When the output of the flip-flop 21 is less than ground, the NPN transistor 24 is off and the PNP transistor 29 is rendered conductive by current flowing from the source V through the base-emitter junction of the PNP transistor 29 and through the resistor 32, thus saturating the PNP transistor 29. The first side of the resistor 12 is thereby brought to within the saturation voltage of the PNP transistor 29 to the voltage V. It should be noted that with the voltage below ground at the output of the flip-flop 21, the switched bias resistor 37 is properly arranged to draw collector bias current so that the transistor 29 is operating at a lower dynamic output impedance than it would be without the switched bias resistor 37. In a like manner, when the output of the flip-flop 21 is above the voltage V, the PNP transistor 29 is back biased and therefore cut off while current flows from the flip-flop 21 through the resistor 33 and the base-emitter junction of the NPN transistor 24. The NPN transistor 24 saturates and the first side of the resistor 12 is brought to within the saturation voltage of the transistor 24 to ground. It should be noted that now the switched bias impedance 37 has a positive voltage thereacross and so arranged that collector bias current is provided for NPN transistor 24. Therefore, it is seen that the provision of the switched bias impedance 37 enables a pair of complementary transistors operated in class B to be provided with collector saturation bias current which tends to minimize saturation voltage variations at the collectors thereof.

With the voltage V on the emitter 31 of the transistor 29 negative with respect to ground, the circuit 17 continues to switch the first end of the resistor 12 between the voltage V and ground. One would expect that a negative voltage V on the emitter 31 of the transistor 29 would reverse bias both the transistors 29 and 24 so that the switching signals applied by the flip-flop 21 would be 180° out of phase from that required to properly operate them. Because of the switched bias resistance 37, however, when the output of the flip-flop 21 is negative, current is drawn through the switched bias resistance 37 which tends to make the first side of the resistor 12 negative with respect to ground. The circuit 17 will continue to switch the first side of the resistor 12 to the voltage V so long as the voltage, to which the junction of the switched bias resistor 37 and the resistor 12 goes upon application of the output of the flip-flop 21 with both transistors 24 and 29 off, is more negative than the voltage V.

The circuit 18 in FIG. 3 employs an NPN transistor 38 and a PNP transistor 39 connected in a complementary emitter-follower configuration which is connected between ground and a voltage V, not shown. A pair of resistors 41 and 42 are tied together at a first end and connected to a first output 43 of the flip-flop 22. The other ends of the resistors 41 and 42 are connected to the bases 44 and 46 of the transistors 38 and 39, respectively. A switched bias resistance 47 is connected between the common emitters of the transistors 38 and 39 and a second output 48 of the flip-flop 22. The output 48 of the flip-flop 22 is an inverted signal identical in magnitude with the output signal appearing at the output 43. It should be apparent that since the emitter followers in the circuit 18 do no invert the signal as the common emitter transistors do in the circuit 17, it is necessary to invert the signal applied to the switched bias resistance 47 in order to obtain the advantages offered by the switched bias resistance 37 in the circuit 17. As in the circuit 17, the output of the circuit 18 is taken from the junction of the switched bias resistance 47 with the transistors 38 and 39. The resistor 12 is connected between the output of the circuit 18 and the output terminal 16.

In FIG. 4 the circuit 19 shows how one would employ a switched bias impedance 49 in a class B circuit composed of two transistors of the same conductivity type. An emitter 53 of an NPN transistor 51 is connected to a collector 54 of an NPN transistor 52 both of which are connected to a first side of the switched bias impedance 49. The resistor 56 is connected between a base 57 of the transistor 52 and a second side of the switched bias resistor 49. The junction of the switched bias resistor 49 and the resistor 56 are driven from a first output terminal 58 of the flip-flop 23. A resistor 59 is connected between a second output terminal 61 of the flip-flop 23 and a base 62 of the transistor 51. The output 61 of the flip-flop 23 provides a signal which is substantially an inverted representation of the signal appearing at the output of the flip-flop 23. Here it is seen that when a switched bias impedance is used with an inverting stage, a signal of the same polarity is applied to the base drive resistor of that stage as to the switched bias impedance. When a non-inverting stage is employed, an inverted signal must be applied to the switched bias impedance. It should be noted here that the switched bias impedance is not a feedback component since the switched bias impedance is driven from a low impedance source so that the signal appearing at the output of the circuits 17, 18, and 19 does not affect the signal at the input thereof, but rather one might look upon the switched bias impedances 37, 47, and 49 as feedforward components.

Figure 5:
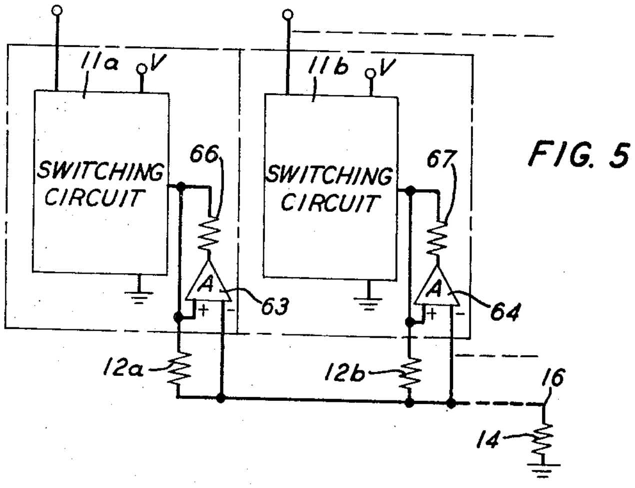
FIG. 5 is a circuit diagram showing the digital-to-analog converter of FIG. 1 improved by a technique operable in conjunction with transistor switching circuits of this invention when employed in digital-to-analog converters.

The saturation voltage variations causing errors in the digital-to-analog converter, shown in FIG. 1, can be further reduced when the switching circuits 11*a*, 11*b*, and 11*c* employ the switched bias impedance concept. A modification of the digital-to-analog converter, shown in FIG. 1, may be seen in FIG. 5 where the currents in the resistors 12*a* and 12*b* are sampled by inverting amplifiers 63 and 64 to provide cancellation currents through resistors 66 and 67, respectively, to the outputs of the switching circuits 11*a* and 11*b*. The effective currents due to the currents flowing in the resistors 12*a* and 12*b*, et cetera, which flow in the output circuits 11*a* and 11*b*, et cetera, are made as close to zero as practical. If the circuits 11*a* and 11*b* do not employ switched bias impedances, this technique might be self defeating for, as the currents flowing in the saturated transistors 11*a* and 11*b* were reduced to zero, the dynamic impedance seen at the output thereof would increase so that minor current variations would produce large voltage errors. By providing switched bias current to reduce the dynamic output impedance of the transistors, the cancelling effect of the currents flowing in the resistors 66 and 67, respectively, provides a reduced current therein at a reduced dynamic impedance level.

A constant current may be obtained in the output junction of each switching circuit 11*a*, 11*b*, et cetera, by employing an inverting amplifier, not shown, across the resistor 14. This amplifier will respond to variations in the currents flowing in each of the weighted resistors 12*a*, 12*b*, et cetera. A plurality of resistors, not shown, may be connected from the output of the inverting amplifier, not shown, one to each of the output junctions of the switching circuits 11*a*, 11*b*, et cetera. The value of each resistor is adjusted so that the current flowing in each output junction is constant notwithstanding the variations at the output 16 of the digital-to-analog converter due to digital input value variations. The current, however, flowing in the output junction will vary as the voltage V varies. Therefore, the switched bias impedance is still necessary to maintain the low dynamic impedance of the switching circuits 11*a*, 11*b*, et cetera for low values of the voltage V.

It is to be understood that the above-described embodiments are simply illustrative of a particular application of the principles of the invention and many other modifications may be made without departing from the spirit and scope of the invention.

What is claimed is:

1. In combination:

a load impedance having a first and second side, said second side being held at a reference potential;

a first device having a control electrode and first and second controlled electrodes, said device being responsive to the simultaneous presence of a first drive signal at said control electrode and a bias voltage of a first polarity between said first and second controlled electrodes for reducing the impedance between said first and second controlled electrodes;

a second device having a control electrode and first and second controlled electrodes, said device being responsive to the simultaneous presence of a second drive signal at said control electrode and a bias voltage of a second polarity between said first and second controlled electrodes for reducing the impedance between said first and second controlled electrodes;

means for connecting said first controlled electrode of said first device to said first controlled electrode of said second device to form an electrode junction;

means for connecting said first side of said load impedance to said electrode junction;

a switched bias impedance device having first and second sides;

means for connecting said first side of said switched bias impedance device to said electrode junction;

means for generating said first and second drive signals; and means for connecting said second side of said switched bias impedance to said drive signal generating means.

2. In combination:

an NPN transistor having a base, an emitter and a collector;

a PNP transistor having a base, an emitter and a collector;

means for connecting said emitter of said NPN transistor to said emitter of said PNP transistor to form an output junction;

a first resistor having first and second ends;

means for connecting said first end of said first resistor to said base of said NPN transistor;

a second resistor connected between said base of said PNP transistor and said second end of said first resistor to provide an input junction;

means having first and second terminals for generating an in-phase signal at said first terminal and an inverted signal at said second terminal;

means for connecting said first terminal to said input terminal; and a third resistor connected between said second terminal and said output junction.

3. In combination:

a first transistor having a base, an emitter and a collector;

a second transistor having a base, an emitter and a collector;

means for connecting said collector of said first transistor to said emitter of said second transistor, to form an output junction;

a first resistor having first and second ends;

means for connecting said first end of said first resistor to said base of said first transistor;

a second resistor connected between said output junction and said second end of said first resistor to form an input junction;

means having first and second terminals for generating an in-phase signal at said first terminal and an inverted signal at said second terminal;

means for connecting said first terminal to said input terminal; and a third resistor connected between said second terminal and base of said second transistor.

4. In combination:

a first NPN transistor having a base, an emitter and a collector;

a first PNP transistor having a base, an emitter and a collector;

means for connecting said collector of said first NPN transistor to said collector of said first PNP transistor to form a first output junction;

a first resistor having first and second ends;

means for connecting said first end of said first resistor to said base of said first NPN transistor;

a second resistor connected between said first output junction and said second end of said first resistor;

a third resistor connected between said base of said first PNP transistor and said second end of said first resistor; and a load impedance connected between said output junction and ground.

5. The combination as defined in claim 4 including:

a second NPN transistor having a base, an emitter and a collector;

a second PNP transistor having a base, an emitter and a collector;

means for connecting said collector of said second NPN transistor to said collector of said PNP transistor to form a second output junction;

a fourth resistor having first and second ends;

means for connecting said first end of said fourth resistor to said base of said second NPN transistor;

a fifth resistor connected between said second output junction and said second end of said fourth resistor;

a sixth resistor connected between said base of said second NPN transistor and said second end of said fourth resistor;

a load resistor having a first end at a reference potential and a second end;

a first weighted resistor connected between said first output junction and said second end of said load resistor; and a second weighted resistor connected between said second output junction and said second end of said load resistor.

6. In combination:

a first NPN transistor having a base, an emitter and a collector;

a first PNP transistor having a base, an emitter and a collector;

means for connecting said collector of said first NPN transistor to said collector of said first PNP transistor to form a first output junction;

a first resistor having first and second ends;

means for connecting said first end of said first resistor to said base of said first NPN transistor;

a second resistor connected between said first ouptut junction and said second end of said first resistor;

a third resistor connected between said base of said first PNP transistor and said second end of said first resistor; and a load impedance connected between said output junction and ground;
a second NPN transistor having a base, an emitter and a collector;
a second PNP transistor having a base, an emitter and a collector;
means for connecting said collector of said second NPN transistor to said collector of said PNP transistor to form a second output junction:
a fourth resistor having first and second ends;
means for connecting said first end of said fourth resistor to said base of said second NPN transistor;
a fifth resistor connected between said second output junction and said second end of said fourth resistor;
a sixth resistor connected between said base of said second NPN transistor and said second end of said fourth resistor;
a load resistor having a first end at a reference potential and a second end;
a first weighted resistor connected between said first output junction and said second end of said load resistor;
a second weighted resistor connected between said second output junction and said second end of said load resistor; and
means responsive to current variations through said first weighted resistor for applying a current related thereto to said first output junction so that the current flowing into the output junction is essentially constant.

7. The combination as defined in claim 6 wherein said current supplying means includes:
a differential amplifier having inverting and noninverting input terminals and output terminal;
means for connecting said noninverting input terminal to said output junction;
means for connecting said inverter of said input terminal to said second end of said load resistor; and
a current determining resistor connected between said output of said differential amplifier and said first output junction.

References Cited

UNITED STATES PATENTS

| | | | |
|---|---|---|---|
| 3,155,963 | 11/1964 | Boensel | 340—347 |
| 3,160,874 | 12/1964 | Hamori | 340—347 |
| 3,214,750 | 10/1965 | Hamori | 340—347 |
| 3,363,191 | 1/1968 | Boughtwood et al. | 330—13 X |
| 3,411,019 | 11/1968 | Jorgensen | 307—255 X |
| 3,418,495 | 12/1968 | Bose | 307—254 X |
| 3,430,068 | 2/1969 | McTaggart | 330—13 X |
| 3,443,237 | 5/1969 | Prozeller | 330—13 X |

MAYNARD R. WILBUR, Primary Examiner
G. R. EDWARDS, Assistant Examiner

U.S. Cl. X.R.

307—254; 235—150.52